United States Patent [19]

Gräber

[11] Patent Number: 5,541,424
[45] Date of Patent: Jul. 30, 1996

[54] PERMEABLE BASE TRANSISTOR HAVING LAMINATED LAYERS

[75] Inventor: Jürgen Gräber, Jülich, Germany

[73] Assignee: Forschungszentrum Julich GmbH, Julich, Germany

[21] Appl. No.: 256,600

[22] PCT Filed: Dec. 19, 1992

[86] PCT No.: PCT/DE92/01080

§ 371 Date: Jul. 23, 1994

§ 102(e) Date: Jul. 23, 1994

[87] PCT Pub. No.: WO93/13560

PCT Pub. Date: Jul. 8, 1993

[30] Foreign Application Priority Data

Dec. 23, 1991 [DE] Germany ............. 41 42 595.2
Dec. 23, 1991 [DE] Germany ............. 41 42 654.1

[51] Int. Cl.⁶ ................. H01L 29/74; H01L 31/111

[52] U.S. Cl. .............. 257/135; 257/266; 257/287; 257/523; 257/592

[58] Field of Search ................. 257/592, 266, 257/136, 287, 523, 135

[56] References Cited

U.S. PATENT DOCUMENTS

| | | | |
|---|---|---|---|
| 3,381,189 | 4/1968 | Hinkle, Jr. et al. | 257/266 |
| 3,767,982 | 10/1973 | Teszner et al. | 257/266 |
| 4,903,089 | 2/1990 | Hollis et al. | 257/266 |
| 5,122,853 | 6/1992 | Lüth | 257/592 |

*Primary Examiner*—Robert P. Limanek
*Attorney, Agent, or Firm*—Herbert Dubno

[57] ABSTRACT

An electronic component especially a p-channel or n-channel permeable base transistor (PBT) is provided as a plurality of layers, fabricated in a laminated composite, and with at least one laterally structured layer provided for controlling a space charge zone, especially a base of the electronic component.

12 Claims, 2 Drawing Sheets

PERMEABLE BASE TRANSISTOR HAVING LAMINATED LAYERS

CROSS REFERENCE TO RELATED APPLICATION

This application is a national phase of PCT/DE 92/01080 filed 19 Dec. 1992 and based, in turn on German national applications P 41 42 654.1 filed 23 Dec. 1991, and P 41 41 42 595.2 of 23 Dec. 1991 under the International Convention.

FIELD OF THE INVENTION

The invention relates to an electronic component, especially a p-channel or n-channel permeable base transistor [PBT] with a plurality of layers, fabricated in a laminated composite, and with at least one laterally structured layer provided for controlling a space charge zone, especially a base of the electronic component.

The invention further relates to a process for manufacturing such a component.

BACKGROUND OF THE INVENTION

For use in super computers and fast data networks in the context of information technology, there are under development integrated circuits as fast microwave components. Of greater significance are integrated circuits on GaAs chips. Components which have been used hitherto in this context are the MESFET and the HEMT. They both are so-called field effect transistors (FET), in which the current transport is parallel to the surface of the chip. An important speed determining parameter, the so-called "transit time under the gate" is here limited by the smallest lateral structuring of the gate achievable lithographically.

The permeable base transistor (PBT) proposed already in 1979, also deals with the principle of a field effect transistor, although with a current flow direction perpendicular to the chip surface, in which the "transit time under the gate" was significantly reduced.

This had its basis in that the gate length in the vertical structuring was given by the thickness of the epitactically deposited base layer. With the methods of modern epitaxy, like modular beam epitaxy (MBE), metal organic gas phase epitaxy (MOCVD) or metal organic molecular beam epitaxy (MOMBE, CBE, GSMBE) for production of the metallic structured base, layer thicknesses in the range of several atom layers can be produced in a controlled manner.

German Patent Application DE 40 25 269.8 describes a permeable base transistor of GaAs. Several layers are bonded with one another to form the active elements of the components, namely, emitter, base and collector. The lateral finger-like structured base forms at its boundary surface a pn transition with the material surrounding it. These components as a result of this characteristic have also been designated as permeable junction base transistors (PJBT). The thus formed space charge zone is controllable via the highly doped conductive base. The basic material for the region surrounding the base and to which the current channels between the fingers of the base belong, is GaAs with an n-doping in the range of $10^{17}$ to $10^{18}$ cm$^{-3}$. The p-doping of the base in the range of $10^{20}$ to $10^{21}$ cm$^{-3}$ is achieved with the aid of a carbon doping.

The space charge zones formed on the boundary surface of the base are used for control of the electric current in the region of the current channels with the aid of a suitable voltage bias on the base. In this case it is a disadvantage that in the remaining space charge zone in the region of the lateral boundary surface of the base layer and spreading out therefrom, there is a parasitic space charge capacitance which limits the switching speed of the component disadvantageously.

OBJECTS OF THE INVENTION

It is an object of the invention to provide an electronic component of the type described in which this effect is reduced and which enables an increased switching speed. It is also an object to provide a corresponding method of making such a component.

SUMMARY OF THE INVENTION

These objects are achieved with an electronic component wherein: a pn- transition is provided as the space charge zone with a p- conducting and a n- conducting layer, the laterally structured base is provided as one of the two layers forming the pn transition, and at least on one, especially on both of the two lateral boundary surfaces of the base, an additional layer is provided showing the same lateral structuring for the purposes of reducing parasitic space charge capacitance in the region of the lateral boundary surface provided on the base and especially which are not for control of the space charge zone.

Thus the laterally structured base is provided with one of the two pn transitions as the controllable space charge zone forming layer. The base contains on at least one of its two lateral boundary surfaces, at least one additional layer which is equally laterally structured and serves to reduce parasitic space charge capacitance in the region of the lateral boundary surface of the base.

An advantageous further reduction of this parasitic space charge capacitance is then achieved when on both lateral boundary surface of the base, such a layer is provided. It is therefore advantageous to provide a semiconductive material with a doping reduced by at least a factor of 10 with respect to the charge carrier doping of the base as the material for this additional layer.

It can be advantageous, moreover, that within the layer a variation of the doping is provided whereby during epitaxial growth, for example, a targeted change of the doping substance can be achieved. An especially advantageous embodiment of the component of the invention resides in that as the material for filling the respective region in the openings of the laterally structured base, which provides a single current channel, semiconductive material is provided which from the viewpoint of charge carrier doping, but also through the partial replacement of an element of the semiconductor (e.g. Al in GaAs Al$_x$Ga$_{1-x}$As), enables the deposition of a semiconductive heterostructure to provide an additional possibility to improve the current transport mechanism.

A further, especially advantageous, embodiment of the electronic component resides in that the base is structured laterally in a sieve shaped.

Advantageously, the base can have lateral circular-shaped and/or oval and/or square openings. This is possible because the PJBT is homogeneously constructed, i.e. only from semiconductor material (e.g. GaAs). In this case, the space charge zone extends substantially uniformly from all sides into the current channel. As a result the latter can be constricted in two lateral directions, i.e. two-dimensionally upon spreading of the space charge zone. In addition, this sieve structure, by contrast with a finger-like structure of the base, achieves a higher rate of rise, i.e. greater slope, of the component for the same voltage change in the form of a greater current change in the channel.

Moreover a stronger spread of the space charge zone toward the hole center of the respective channel is generated by comparison to the spread of the space charge zone on the lateral boundary surface. This simplifies the lithographic requirements because for a given current control, by comparison 1.4 times larger dimensions are obtained. A reduction of the RC time constant results in an increase in the switching speed of the component. Anyway, it can be advantageous to select the appropriate lateral dimensions of the openings contained in the sieve shape or their lateral cross sections from opening to opening or optionally to make them different. Thus one obtains current channels with individually selectable lateral dimensions. It is conceivable to select the geometric dimensioning of the openings of the sieve shape in a mathematic relationship to respective other openings so that by such a definition of the sieve shape, a given sub-linear or super-linear or nonlinear current-voltage characteristic is obtained for the component. For example, one can conceive of a sieve shape of circular openings in which the diameters of the neighboring opening differ by a factor of 2.

The invention advantageously provides for the selection as the material for the base of AlGaAs. Where GaAs is selected as the basic material for the remaining active component layers within the layer sequence, a base composed of AlGaAs forms an etching stop or etching resist upon appropriate selection of the etching agent. As a consequence, also by the relatively reduced layer thickness of the base, for example, the contacting of the base layer can provide a targeted stopping of the etching of the layers applied over the base until the surface of the base chemically different from GaAs has been penetrated to the correct depth. It will be self understood that the choice of this material is not limited only to the base. In addition, there is a possible location of such an etch stop where the overgrown channel should begin and directly over the highly doped layers which must be formed with contacts.

The invention also comprises an electronic component with a plurality of layers fabricated in a laminated composite and with at least one laterally structured layer provided to control a space charge zone, characterized in that as the lateral structuring of this layer a sieve shape is provided. This sieve structure, by contrast with a finger-like structure of the base, as previously noted achieves a higher rate of rise or greater slope of the component for the same voltage change in the form of a greater current change in the channel. Moreover a stronger spread of the space charge zone toward the hole center of the respective channel is generated by comparison to the spread of the space charge zone on the lateral boundary surface.

BRIEF DESCRIPTION OF THE DRAWING

The above and other objects, features, and advantages will become more readily apparent from the following description, reference being made to the accompanying drawing in which.

SPECIFIC DESCRIPTION

Figure 1:
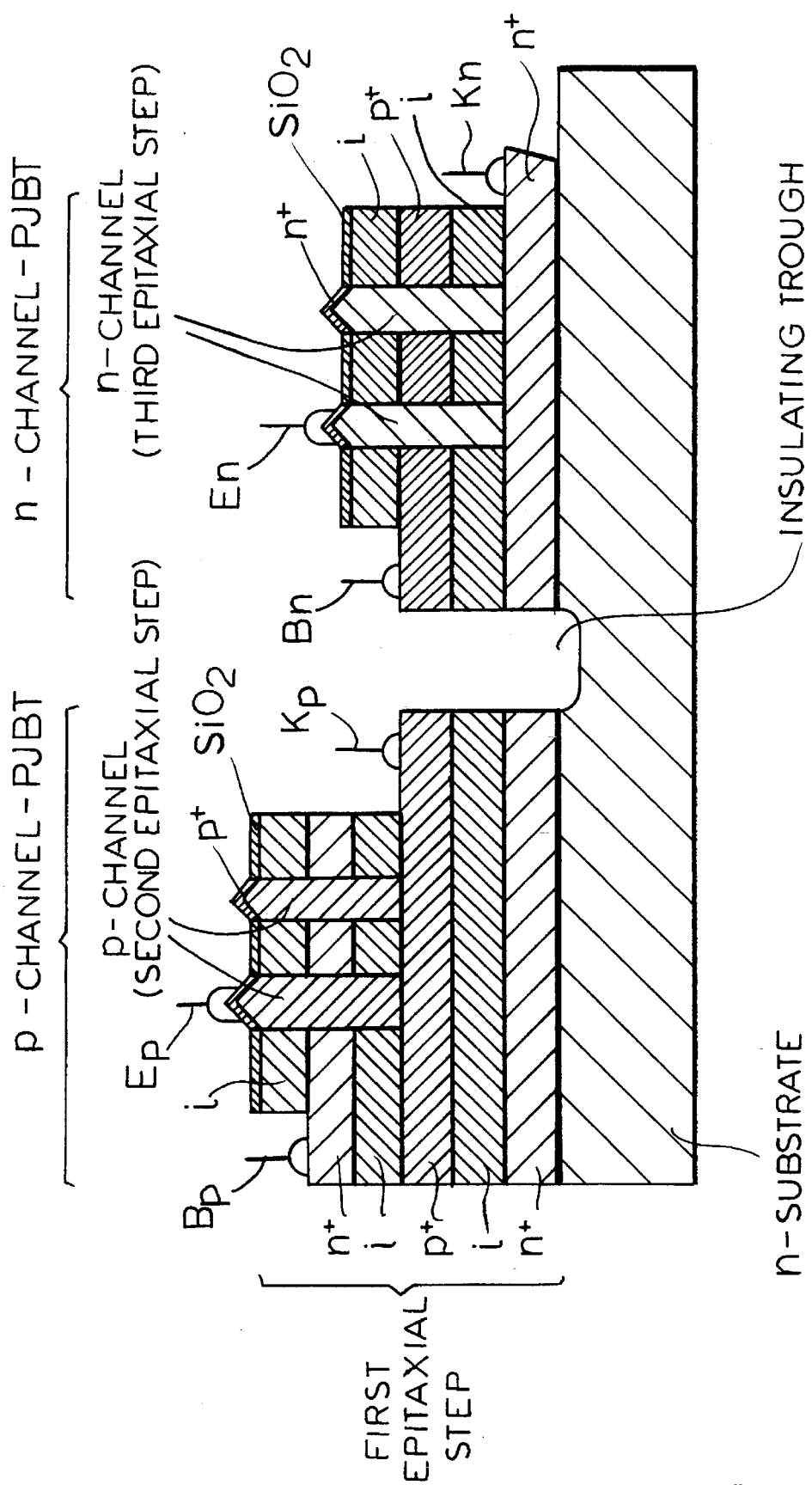
FIG. 1 is a cross sectional view diagrammatically showing a component according to the invention.

In FIG. 1, a component according to the invention is shown, comprised of a p-channel and an n-channel PJBT on a single chip.

From the point of view of the process, the component in FIG. 1 is fabricated as follows:

In a first epitaxial process, a layer sequence is produced in which, upon a substrate of n-doped GaAs, a $n^+$-i-$p^+$-i-$n^+$-i-layer sequence is grown epitactically in GaAs. ($n^+/p^+$ signifies n or p doped GaAs, i signifies intrinsic GaAs). In a subsequent step, an $SiO_2$ layer is vapor deposited upon this layer sequence. Thereafter, with the aid of an appropriate mask, the $SiO_2$ cover layer is opened to form an etching mask for the production of the current channels of the p-PJBT. Next, with the aid of a reactive ion etching process and the etching mask structured as defined from the $SiO_2$ cover layer, the region provided for growth of the current channels is etched free to the $p^+$ layer. In a further epitaxy step, this etched region is filled with p-doped GaAs.

Finally, even these field channels are covered with an $SiO_2$ layer.

To form the n-permeable base transistor shown in the right-hand part of the FIGURE, the there initially provided $SiO_2$ cover layer as well as the upper i-layer and $n^+$ layer are removed with the aid of an appropriate etching process. On the now highest lying plane or layer, $SiO_2$ is newly vapor deposited and in known manner opened with the aid of a suitable etching mask for forming the regions provided for the current channels of the n-PJBT. Thereafter these are filled up to the $n^+$ layer etched region in a third epitaxial step with n-doped GaAs and closed with an $SiO_2$ cover layer. For contacting, the highly doped $n^+$ or $p^+$ layers are exposed by etching and simultaneously for separating the regions provided as p channel PJBT or n channel PJBT, an insulating trough is etched on the n-doped substrate and the contacts are produced.

The component shown in FIG. 1 represents an example of integration of multiple components on the same chip. It will be self-understood that further components, as, for example, lasers constructed from PJBT's and photodetectors can be additionally provided upon the chip.

By corresponding wiring, which advantageously also can be effected through the $p^+$ or $n^+$ layers, or via additional, deeper lying layers, optional circuits can be fabricated, e.g. an inverter comparable to a C-MOS-inverter or a Darlington circuit.

For this purpose, it is of special significance that the individual transistors upon fabrication of the epitactic layer sequence, are provided with the $SiO_2$ cover layer. Advantageously these layer sequences are thus preserved so that at other locations on the same chip further individual components can be fabricated.

The cover layer can be made from $SiO_2$, as indicated, but also from $Si_3N_4$ or another suitable material. The material should thus be suitable as an etching mask, especially for reactive ion etching (RIE). For this the layer sequence in the semiconductor material (e.g. GaAs) should have as much as possible no diffusion and finally should enable selective epitaxy with sufficiently good characteristics.

Through the relatively small space-saving PJBT's of the invention and such an advantageous effective integration method, very high integration densities can be achieved. The above indicated cover layers can thus be used as "substrates" for further epitactically grown layer sequences so that therewith a three dimensional networking on a single chip can be realized.

Figure 2:
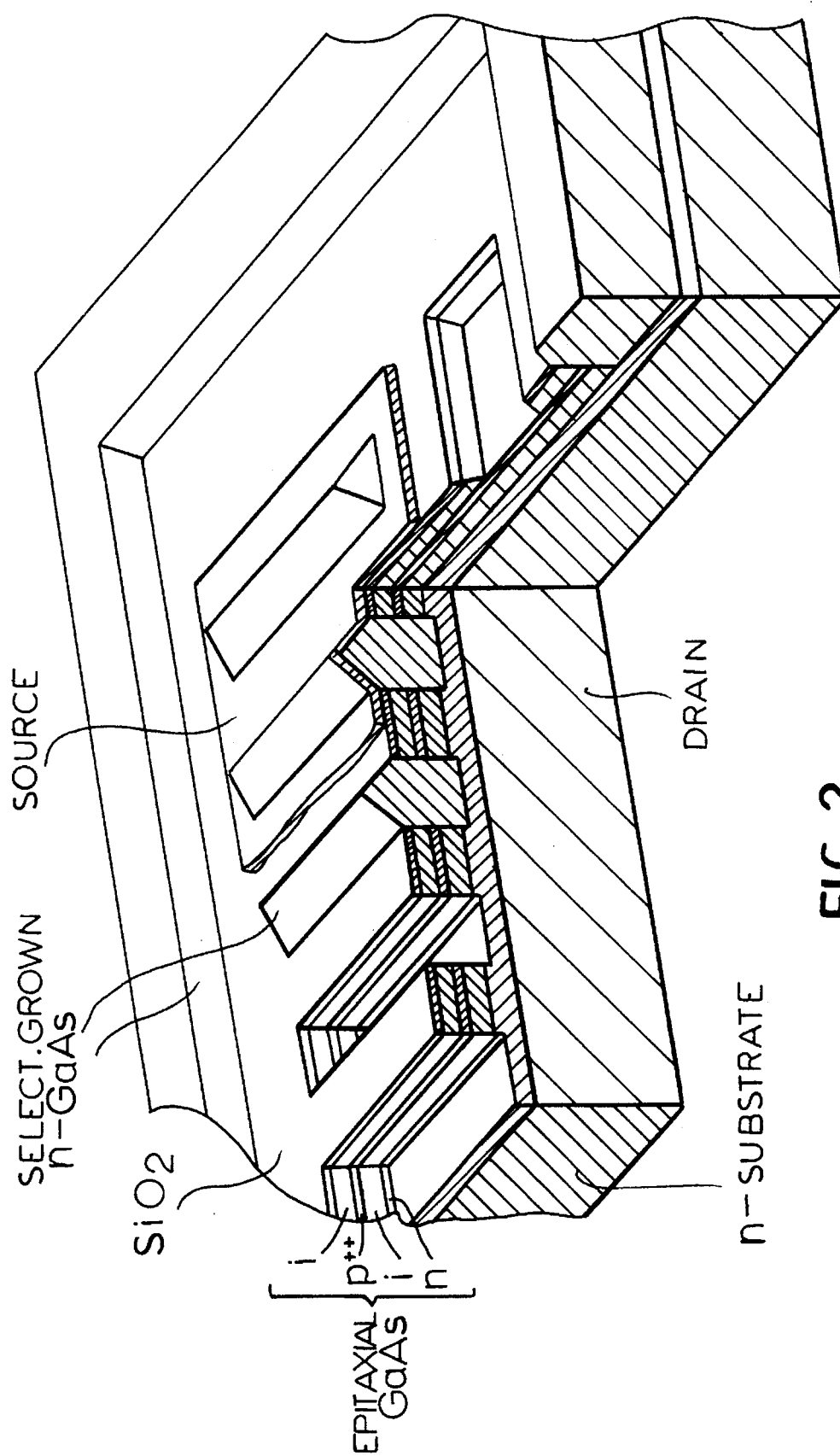
FIG. 2 is perspective view, partly in section, of such a component.

In FIG. 2 the schematic section of a PJBT according to the invention is illustrated, with a p-doped, laterally rectangular, sieve-shaped base.

Upon a silicon doped GaAs wafer ($n=3\times10^{18}$ cm$^{-3}$) a layer sequence: nip$^{++}$i is deposited by means of MOMBE to a thickness of 900 nm.

After the epitaxy, a 60 nm thin $SiO_2$ layer is vapor deposited and to improve the oxide, is tempered for several minutes at 550° C. Thereafter fine structuring up to 0.5 μm is generated photolithographically (UV) with a reverse lacquer (AZ 5206 IR).

Using $CHF_3$, the oxide is opened by reactive ion etching (RIE), the lacquer is removed with $O_2$ plasma and finally troughs are etched in the oxide transfer mask through all layers to the n GaAs. The $SiO_2$ is a satisfactory mask for $H_2/CH_4$-RIE since it enables the generation of substantially perpendicular flanks. With such a process a polymide is formed that again with $O_2$-plasma can be removed.

Prior to the renewed insertion in the epitaxial growth apparatus, the structured wafer must be cleaned by a wet chemical etching whereby in comparison with the structuring only thin surface layers are removed and the $SiO_2$ layer is not attacked. The parameters for the second etpitaxy are so selected that the channels are filled with GaAs of the desired doping and simultaneously the $SiO_2$ surface remains free. By means of this selectively filling epitaxy, only the previously etched troughs are filled and the distance between source and gate can be predetermined in the first epitaxy by the there-selected layer thickness of the intrinsic cover layer. Thereafter, with several masking steps utilizing a liftoff process, metallization is vapor deposited for the contacts. For the source contact Au-Ge/$SiO_2$ or Ni/Au-Ge/Ni can be utilized and can form by alloying at about 400° C. respective ohmic contacts.

Thereafter the $SiO_2$ and, with $H_3PO_4$:$H_2O_2$, the i-GaAs over the gate are removed. Ti/Au is vapor deposited to yield an ohmic contact to the p$^{++}$-GaAs and can also serve as contact reinforcement for the source contact. The drain contact is made above the backside of the wafer or simultaneously with the source contact. (NOTE: The drain, source and gate correspond to the concepts of collector, emitter and base).

I claim:

1. An electronic device comprising:

a semiconductor substrate;

a first doped layer of a first conductivity type formed on said substrate;

a second doped layer of a second conductivity type formed on said first layer, one of said conductivity types being n conductivity and the other of said conductivity types being p conductivity, one of said layers forming a laterally structured base with openings therethrough defining opposite edges for control of a space charge zone in a pn transition between said base and a doped material of opposite conductivity type from said base and different from the first doped layer;

an additional layer with at most one tenth the doping of said one of said layers disposed on said one of said layers and interposed between said first and second layers with edges coinciding with said edges of said base for reducing parasitic space charge capacitance, said layers forming a composite laminate;

a body of said material filling said openings and abutting coinciding edges of said additional layer and said one of said layers and forming a current channel of said device, said material abutting opposite edges of said base having individually stepped doping profiles; and respective terminals connected to said first and second layers and to said body.

2. The electronic device defined in claim 1 wherein said additional layer is an intrinsic semiconductor.

3. The electronic device defined in claim 2 wherein said body of said material in said openings is GaAs.

4. The electronic device defined in claim 2 wherein the layers are composed of GaAs and said material is Al containing GaAs.

5. The electronic device defined in claim 2 wherein said base is structured in a configuration of a sieve.

6. The electronic device defined in claim 2 wherein said openings are circular.

7. The electronic device defined in claim 2 wherein said openings are oval.

8. The electronic device defined in claim 2 wherein said base is a said first layer and is composed of n$^+$ material, said second layer is composed of p$^+$ material, said body forms at least one p channel and said device is a p-channel permeable base transistor.

9. The electronic device defined in claim 2 wherein said base is a said first layer and is composed of p$^+$ material, said second layer is composed of n$^+$ material, said body forms at least one n channel and said device is a n-channel permeable base transistor.

10. The electronic device defined in claim 2 wherein said laminate is formed on a substrate of n-conductivity material and comprises a layer of n$^+$ material on said substrate, a layer of an intrinsic semiconductor on said layer of n$^+$ material, a layer of p$^+$ material on said layer of intrinsic semiconductor and forming one of said first and second layers, another layer of intrinsic semiconductor on said layer of p$^+$ material, a layer of n$^+$ material forming the other of said first and second layers and formed on said other layer of intrinsic semiconductor, a further layer of intrinsic semiconductor on said layer of n$^+$ material forming said other of said first and second layers, and a $SiO_2$ layer on said further layer of intrinsic semiconductor, said device having a p-channel permeable base transistor separated from an n-channel permeable base transistor by a trough extending through said layers and into said substrate, said p-channel permeable base transistor having said base formed from said layer of n$^+$ material forming the other of said first and second layers with said body of said p-channel permeable base transistor being formed by a p-conductivity material, said n-channel permeable base transistor having said base formed from said layer of p$^+$ material forming said one of said first and second layers with said body of said n-channel permeable base transistor being formed by an n-conductivity material.

11. The electronic device defined in claim 1 wherein said one of said layers is a doped Si or $Si_xGe_{1-x}$.

12. The electronic device defined in claim 1 wherein said layers are composed of GaAs.

* * * * *